United States Patent [19]

Kawauchi et al.

[11] Patent Number: 5,381,366
[45] Date of Patent: Jan. 10, 1995

[54] NON-VOLATILE SEMICONDUCTOR MEMORY DEVICE WITH TIMER CONTROLLED RE-WRITE INHIBIT MEANS

[75] Inventors: Koichi Kawauchi; Seiichiro Asari, both of Hyogo, Japan

[73] Assignee: Mitsubishi Denki Kabushiki Kaisha, Tokyo, Japan

[21] Appl. No.: 236,002

[22] Filed: May 2, 1994

Related U.S. Application Data

[63] Continuation of Ser. No. 798,095, Nov. 27, 1991, abandoned, which is a continuation-in-part of Ser. No. 771,832, Oct. 8, 1991, Pat. No. 5,278,786, which is a continuation of Ser. No. 461,585, Jan. 5, 1990, abandoned.

[30] Foreign Application Priority Data

Apr. 11, 1989 [JP]  Japan .................. 1-92533

[51] Int. Cl.$^6$ ............................. G11C 11/40
[52] U.S. Cl. ......................... 365/185; 365/189.09; 365/195; 365/228; 365/230.03; 365/233; 365/236
[58] Field of Search ............ 365/185, 230.03, 228, 365/195, 189.09, 233, 236

[56] References Cited

U.S. PATENT DOCUMENTS

| | | | |
|---|---|---|---|
| 4,327,410 | 4/1982 | Patel et al. .................... | 365/228 |
| 4,796,235 | 1/1989 | Sparks et al. .................. | 365/228 |
| 4,811,293 | 3/1989 | Knothe et al. ................. | 365/230.03 |
| 4,853,896 | 8/1989 | Yamaguchi .................... | 365/230.03 |
| 4,975,878 | 12/1990 | Boddu et al. .................. | 365/195 |
| 5,083,293 | 1/1992 | Gilberg et al. ................. | 365/228 |
| 5,119,336 | 6/1992 | Itoh ................................ | 365/195 |
| 5,175,840 | 12/1992 | Sawase et al. ................. | 365/228 |

*Primary Examiner*—Joseph E. Clawson, Jr.
*Attorney, Agent, or Firm*—Lowe, Price, LeBlanc & Becker

[57] ABSTRACT

A nonvolatile semiconductor memory device includes rewritable areas (M10, M20). A control circuit (110) controls a boosting circuit (2) and a writing circuit (10) such that a high voltage is generated from the boosting circuit, and data is written to the rewritable area designated by an address register/decoder (104) by means of the writing circuit. In response to an external signal which is at the "H" level, the control circuit allows writing of data to the rewritable areas (M10, M20) by means of the writing circuit (9). In response to an external signal which is at the "L" level, the control circuit prohibits rewriting of data in the rewritable area (M10), and allows rewriting of data in the rewritable area (M20). Therefore, even if the operation mode is erroneously set to the write mode because of unstable state of the power supply, data in the rewritable area is not destroyed.

6 Claims, 6 Drawing Sheets

NON-VOLATILE SEMICONDUCTOR MEMORY DEVICE WITH TIMER CONTROLLED RE-WRITE INHIBIT MEANS

This application is a continuation of application Ser. No. 07/798,095 filed Nov. 27, 1991, now abandoned; which is a continuation in part of Ser. No. 07/771,832 filed Oct. 8, 1991, U.S. Pat. No. 5,278,786; which is a continuation of Ser. No. 07/461,585 filed Jan. 5, 1990, abandoned.

BACKGROUND OF THE INVENTION

1. Field of the Invention

The present invention relates to non-volatile semiconductor memory devices and, more specifically, to a non-volatile semiconductor memory device having an electrically rewritable non-volatile semiconductor as a memory element.

2. Description of the Background Art

In an EEPROM as an electrically rewritable non-volatile semiconductor memory device, a high voltage of 20 V is applied to a memory cell corresponding to a binary information in accordance with a writing mode signal applied from a controller, and threshold value of the memory cell is changed to receive charges, whereby the information is written. Methods for applying high voltage to the memory cell comprise a method of applying the voltage from a voltage source directly to an external terminal provided in each memory cell, and a method of applying a normal voltage 5 V which is boosted by a boosting circuits provided in an IC to apply the boosted voltage. One example of the latter method is disclosed in Japanese Patent Laying-Open No. 63-7599.

FIG. 4 is a block diagram showing a whole structure of a conventional EEPROM. Referring to FIG. 4, a clock pulse is applied to an input register 101 and data and address are serially input thereto. The input register 101 serially reads the data and the address in response to the clock pulse, loads the data in a data register 103 and loads the address through an address register/decoder 104. The clock pulse is also applied to a timing generation circuit 102, which generates timing signals in response to the clock pulse to apply the same to a mode register 105. The mode register 105 is provided for loading a writing mode signal or an erasing mode signal. The writing mode signal or the erasing mode signal loaded in the mode register 105 is applied to a control circuit 1.

The data loaded in the data register 103 and the address signal loaded in the address register/recorder 104 are applied to a memory cell 100. The writing mode signal is also applied to a boosting circuit 2 and a writing circuit 111. The boosting circuit 2 boost a supply voltage of +5 V to a high voltage of 20 V in response to the writing mode signal or the erasing mode signal to apply the same to the memory cell 100 through the writing circuit 111. When the high voltage is applied to a cell of the designated address, the memory cell 100 writes the information in the cell. A sensing circuit 101 amplifies the information read from the memory cell 100 to apply the same to an output circuit 109.

FIG. 5 is a specific block diagram of the memory cell portion shown in FIG. 4, FIG. 6 is a specific electric circuit diagram of the boosting circuit shown in FIG. 5, and FIG. 7 is a specific electric circuit diagram of a high voltage switch.

Referring to FIGS. 5 to 7, the portions near the memory cell will be described in more detail. FIG. 5 shows an example of a memory matrix MA in which memory cells M11 ... M1n+1, M21 ... M2n+1, M31 ... M3n+1 M41 ... M4n+1 arranged in a matrix of two columns×two rows for rewriting n bit data at one time. The memory cell M11 comprises a selective transistor and a memory transistor. Other memory cells have the same structure. The selective transistor of each of the memory cells M11 ... M1n+1, M21 ... M2n+1, M31 ... M3n+1, M41 ... M4+1 is connected to each other in the row direction by the word lines W1, W2, and in the column direction by digit lines D11 ... 1, D21 ... D2n+1. High voltage switches 71 and 72 are connected to the word lines W1 and W2, high voltage switches 52 ... 5n+1 are connected to the digit lines D11 ..., D1n+1 and high voltage switches 62 ... 6n+1 are connected to the digit lines D21 ... D2n+1. Transistors 81 and 82 transmit high voltage on a control gate line CG1 to the control gate of the memory cells M11 ... M1n+1, M21 ... M2n+1 and transistors 83 and 84 transmit high voltage on a control gate line CG2 to the control gates of the memory cells M31 ... M3n+1, M41 ... M4n+1. Drains of the transistors 81 and 82 are connected to the high voltage switch 51 and the drains of the transistors 83 and 84 are connected to the high voltage switch 61.

The control circuit 1 applies a controlling signal for generating a high voltage from the boosting circuits 2 in the writing mode and in the erasing mode to the boosting circuit 2. The boosting circuit 2 comprises an oscillator 21 as shown in FIG. 6. The oscillator 21 starts the oscillating operation in response to the controlling signal from the control circuit 1. The boosting circuit 2 comprises n channel transistors 23 connected in series with the gates and drains connected to each other and capacitors 24 connected between the source of each of the transistors 23 and the output of the oscillator 21 or an output of an inverter 22 inverting the output from the oscillator 21. The boosting circuit 2 is generally called a charge pump, which boost the output from the oscillator 21 by the combination of the N channel transistors 23 and the capacitor 24 to apply a high voltage to the high voltage switches 51, 52 ... 5n+1, 61, 62 ... 6n+1, 71 and 72.

The control circuit 1 applies a control signal in the writing mode and in the erasing mode to one input end of each of the NAND gates 31 and 41. An address signal Y1 is applied to the other input end of the AND gate 31, and an address signal Y2 is applied to the other input end of the NAND gate 41. Data D1 ... Dn are applied to one input end of the AND gates 32 ... 3n+1, respectively, and the address signal Y1 is applied to the other input end. The data D1 ... Dn are applied to one input end of the AND gates 42 ... 4n+1, respectively, and the address signal Y2 is applied to the other input end. Address signals X1 and X2 are applied to the high voltage switches 71 and 72.

Referring to FIG. 7, the structure of the high voltage switch 50 will be described in the following. An output from any one of the AND gates 31, 32 ... 3n+1, 41, 42 ... 4n+1 and X1, X2 shown in FIG. 5 is applied to the inverter 501. The output from the inverter 501 is applied to the gates of N channel transistor 502 which has its source connected to the ground and its drain connected to the drain of an N channel transistor 503 and to the gate of an N channel transistor 504. The gate and the source of the N channel transistor 503 are connected to one end of a capacitor 505 and to the source of the N channel transistor 504. A high voltage is applied from the boosting circuit 2 to the drain of the N channel transistor 504, while the oscillation output from the oscillator 21 is applied to the other end of the capacitor 505. A high voltage is output from the drain of the N channel transistor 502.

Operation of a conventional EEPROM will be described in the following. The high voltage switch 50 is a switching element for switching a high voltage (about 20 V) for writing into the EEPROM by peripheral 5 V signals. When a "H" level (5 V) signal is input to the gate of the N channel transistor 502, the N channel transistor 502 is turned on and a "L" level signal is output from the drain thereof. When a "L" level (0 V) signal is input to the gate of the N channel transistor 502, the N channel transistor 502 is turned off, and the capacitor 505, and N channel transistors 503 and 504 function as a last stage of the boosting circuit 2 to output a high voltage.

The operation of erasing and writing data in the memory cell M11 which is at the first row and first column of the 2×2 memory cell array MA shown in FIG. 5 will be described in the following as an example. The EEPROM has two modes, that is, the erasing mode and the writing mode. At first, the erasing mode will be described. The erasing of data is carried out by applying a high voltage of about 20 V to the gate (generally called as a control gate) of a memory transistor of the memory cell M11. A control signal for starting oscillation is applied from the control circuit 1 to the oscillator 21 of the boosting circuit 2. The oscillator 21 starts oscillation in response to the control signal and the boosting circuit 2 generates a high voltage. On this occasion, the control signal E output from the control circuit 1 is set to the "H" level, and the data D1 to Dn are set to the "L" level. Now, the information in the memory cell D11 at the first row and first column is to be erased, so that the address signal X1 is set to the "H" level, X2 is set to the "L" level, Y1 is set to the "H" level and Y2 is set to the "L" level. Consequently, the AND gate 31 conducts, the high voltage switch 51 sets the control gate signal CG1 at 20 V and the high voltage switch 71 such the word signal W1 at 20 V. Consequently, the transistor 81 is rendered conductive, a high voltage is applied to the control gate of the memory cell M11, whereby the data is erased.

Writing of the data is carried out by applying a high voltage of 20 V to the drain of a memory transistor in the memory cell. Namely, in the writing mode, the control signal E is set to the "L" level and the data D1 to Dn are set at respective values. The address signals X1, X2, Y1 and Y2 are set in the same manner as in the erasing mode. When the control gate signal CG1 is kept at the "L" level and the data D1 to Dn are at the "L" level, the high voltage is not transmitted to the digital signal D11, so that writing of data to the memory cell is not carried out. When the data D1, for example, is set at the "H" level, the high voltage is transmitted to the digit signal D11, so that writing of data to the memory cell M11 is carried out.

When the EEPROM shown in FIG. 5 is used as a memory element, there is a possibility of the data stored in the EEPROM being destroyed when the power supply is turned on/off or the applied voltage is stopped for an instant. More specifically, the power is supplied through an external terminal to the boosting circuit 2. When the high voltage is applied to the memory cell and the signal output from the controller becomes unstable due to the turning on/off the power supply or the instant stoppage, the memory device may be erroneously set to the writing mode. When a boosting circuit 2 such as shown in FIG. 6 is provided in the memory device and the signal output from the controller becomes unstable due to the turning on/off of the power supply or the instant stoppage, the writing mode may be erroneously set.

Electrical rewriting of data is possible in an EEPROM. However, in most cases, they are used as ROMs, that is, only a portion is used for writing data and other regions are used only for reading with the data once written being maintained as they are. Therefore, various measurements have been proposed in order to prevent fatal damage of the system derived from the destruction of the written data by the above described causes.

For example, measurements such as providing pull up and pull down resistances to an input terminal, provision of a power supply detecting circuit inside or outside of the IC so as to turn off the main power supply after the external signal lines are established, and so on have been proposed. However, these measurements are not enough to prevent erroneous writing.

SUMMARY OF THE INVENTION

Therefore, an object of the present invention is to provide a non-volatile semiconductor memory device allowing rewriting of data in a part of the memory region in response to an externally applied control signal.

Briefly stated, a non-volatile semiconductor memory element including first and second memory areas in which data can be electrically rewritten are provided, rewriting of data to the first and second memory areas are allowed in response to a control signal at a first level, and rewriting of data to the first memory area is prohibited and rewriting of data to the second memory area is allowed in response to an input of the control signal at a second level.

Therefore, according to the present invention, rewriting in the first memory area is allowed only when the externally applied control signal is at the first level, and therefore, even if the memory element is erroneously set to the rewriting mode because of unstable state of the power supply, destructions of data in the first memory area can be prevented.

According to a preferred embodiment of the present invention, a writing allowance signal is output from a gate circuit in response to the control signal applied to a terminal which is at the first level, and data is written to the first or second memory area by the first or second writing circuit. A writing prohibiting signal is output from the gate circuit in response to the control signal at the second level, writing of data to the first memory area by the first writing circuit is prohibited, and writing of data to the second memory area by the second write circuit is allowed by a writing allowance signal from the gate circuit.

In accordance with another preferred embodiment of the present invention, when a power supply voltage is boosted to generate a high voltage and an address signal for designating an address in the first memory area is applied to a first switching circuit, the high voltage is applied to the first memory area and the data are written, and when an address signal for designating the second memory area and the writing allowance signal is applied to a second switching circuit, the high voltage is applied to the second memory area and the data are written therein. More preferably, a first high voltage generating circuit for generating a high voltage for writing data in the first memory area and a second high voltage generating circuit for generating a high voltage for writing data in the second memory area are provided.

In a further, more preferred embodiment, a plurality of memory transistors constituting the first and second memory areas and selective transistors for activating corresponding memory transistors formed corresponding to the memory transistors are provided. When a column address signal for designating column address of the first memory area is applied to a first column switching circuit, a high voltage is applied to a first electrode of the corresponding selective transistor, when a row address signal for designating a row in the first memory area is applied to a first row switching circuit, a high voltage is applied to a control electrode of the corresponding selective transistor, whereby a corresponding memory transistor is activated by the selective transistor to realize data writing. In the same manner, when a column address signal for designating a column in the second memory area is applied to a second column switching circuit, a high voltage is applied to a first electrode of the corresponding selective transistor, and when a row address signal for designating a row address of the second memory area is applied to a second switching circuit, a high voltage is applied to the control electrode of the corresponding selective transistor, whereby data writing in the corresponding memory transistor is realized.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
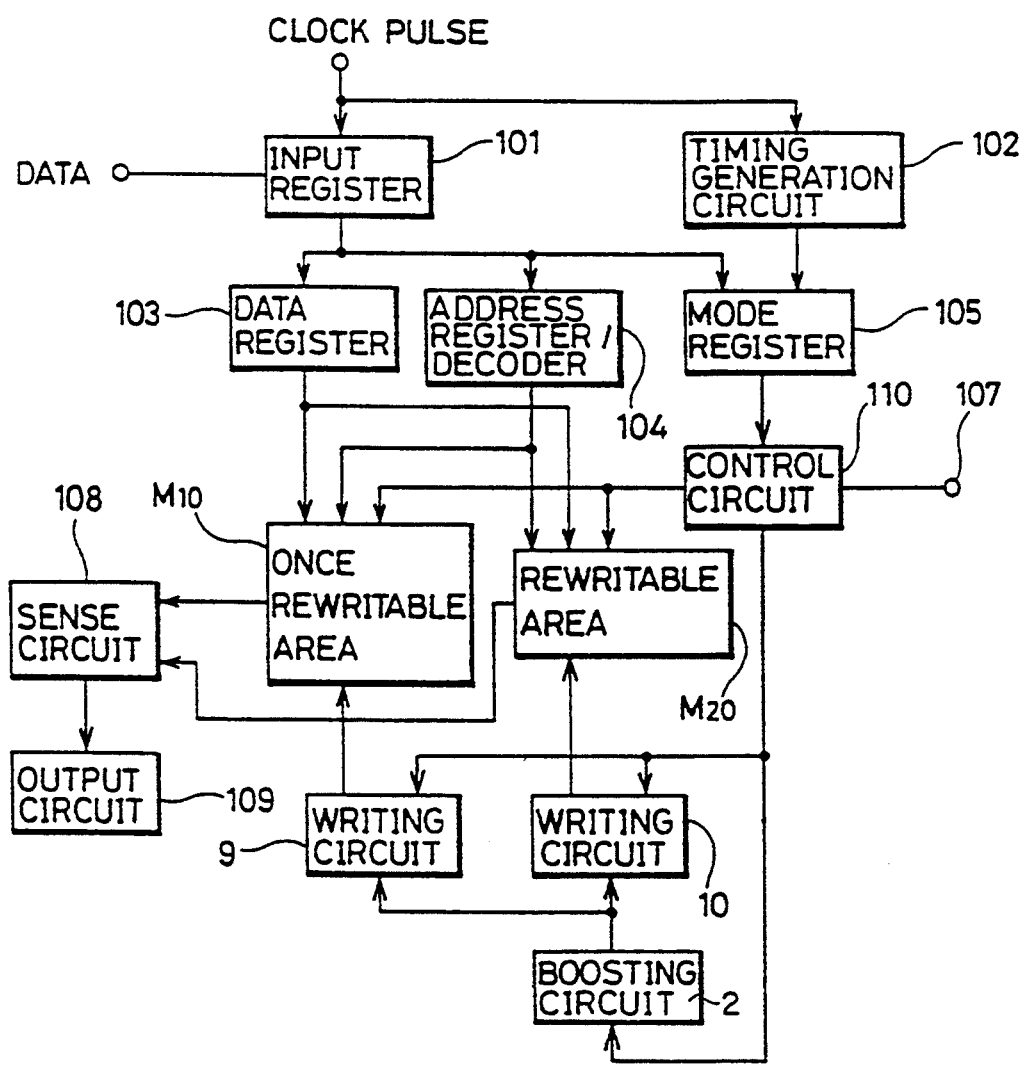
FIG. 1 is a schematic block diagram showing a whole structure of one embodiment of the present invention.

FIG. 1 is a schematic block diagram showing the whole structure of one embodiment of the present invention. Referring to FIG. 1, a memory matrix is divided into an area M10 in which only one rewriting is possible and an area M20 in which rewriting is possible repeatedly. Writing circuits 9 and 10 for writing data in the memory cells are provided corresponding to the areas M10 and M20, respectively. A control circuit 110 allows erasure/writing of data in area M20 in response to an application of a signal at "L" level through an external terminal 107, and allows erasure/writing in areas M10 and M20 in response to an application of a signal at "H" level from the external terminal 107.

Figure 2:
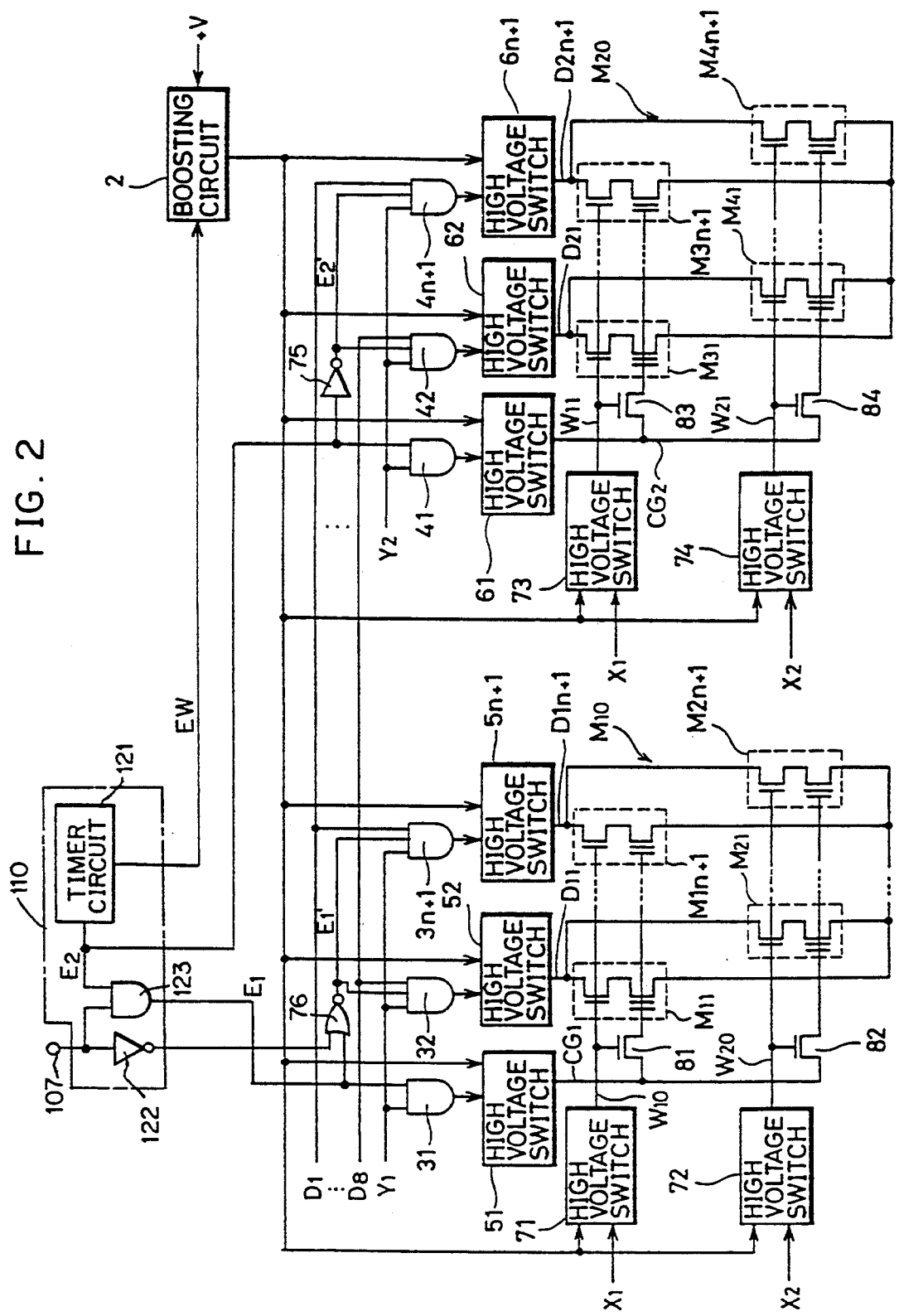
FIG. 2 is a schematic block diagram of memory cell and the peripheral portions shown in FIG. 1.

FIG. 2 is a specific block diagram showing the memory cell and the peripheral portions shown in FIG. 1.

Figure 6:
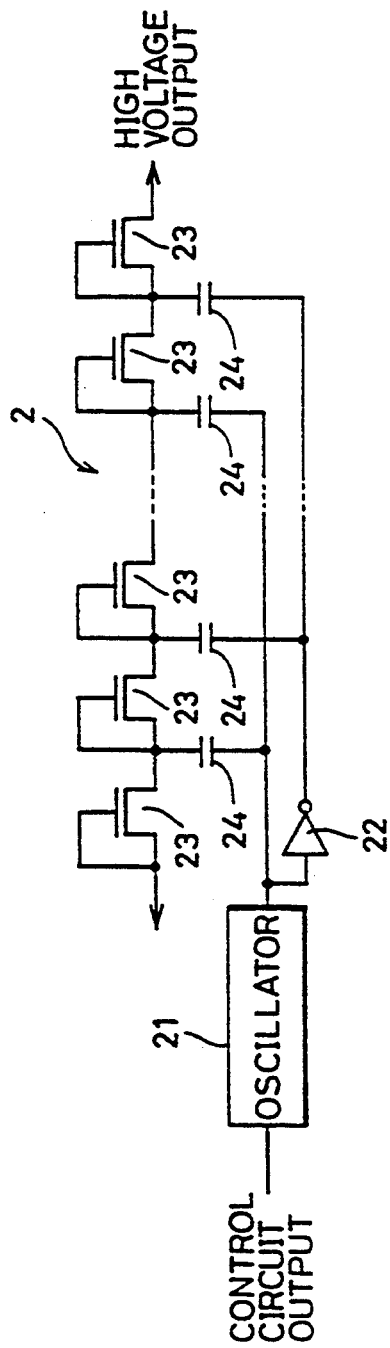
FIG. 6 is a specific circuit diagram of the boosting circuit shown in FIG. 5.
Figure 7:
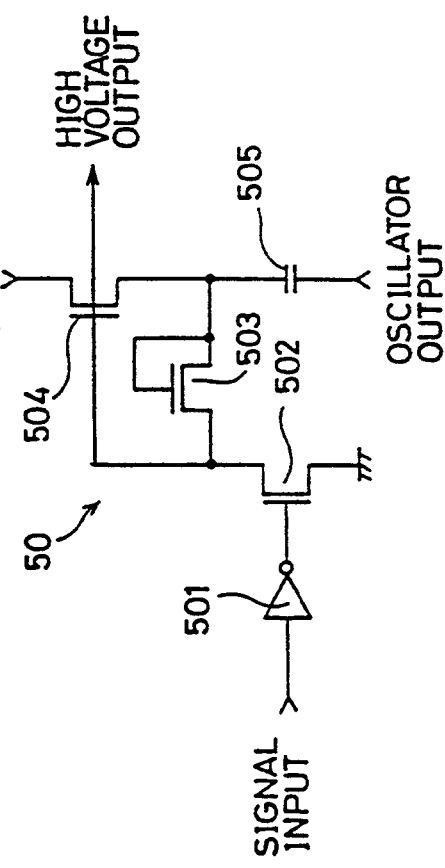
FIG. 7 is a specific circuit diagram of the high voltage switch.

The structure of FIG. 2 is the same as that of FIG. 6 described above except the following points. Namely, the area M10 in which only one rewriting is allowed comprises memory cells M11 ... M1n+1 and M21 ... N2n+1. The rewritable area M20 comprises memory cells M31 ... M3n+1 and M41 ... M4n+1. A word signal line W10 of the area M10 is connected to a high voltage switch 71 while a word signal line W20 is connected to a high voltage switch 72. A word signal line W11 of the area M20 is connected to a high voltage switch 73 while a word signal line W21 is connected to a high voltage switch 74. A high voltage is applied from the boosting circuit 2 to the high voltage switches 73 and 74, and address signals X1 and X2 are also applied to the boosting circuit 2 from the address register/decoder 104 shown in FIG. 1.

Control circuit 110 includes a timer circuit 121, an inverter 122 and an AND gate 123. Timer circuit 121 outputs an EW signal which is kept at "H" only in the time period of erasure/writing in response to an application of an erase mode signal from mode register 105 shown in FIG. 1, and an E2 signal which is kept at "H" level only in the former half of the above mentioned period. The EW signal is applied to the boosting circuit 2. The E2 signal is applied to one input and of AND gate 123, one input end of an AND gate 41, and it is inverted by an inverter 75 to be applied to AND gates 42 ... 4n+1.

The signal applied to external terminal 107 is applied to the other input end of AND gate 123, and is inverted by inverter 122. The inverted signal is applied to AND gates 32 ... 3n+1 through an NOR gate 70. An output signal from AND gate 123 is applied to one input terminal of AND gate 31.

Figure 3A:
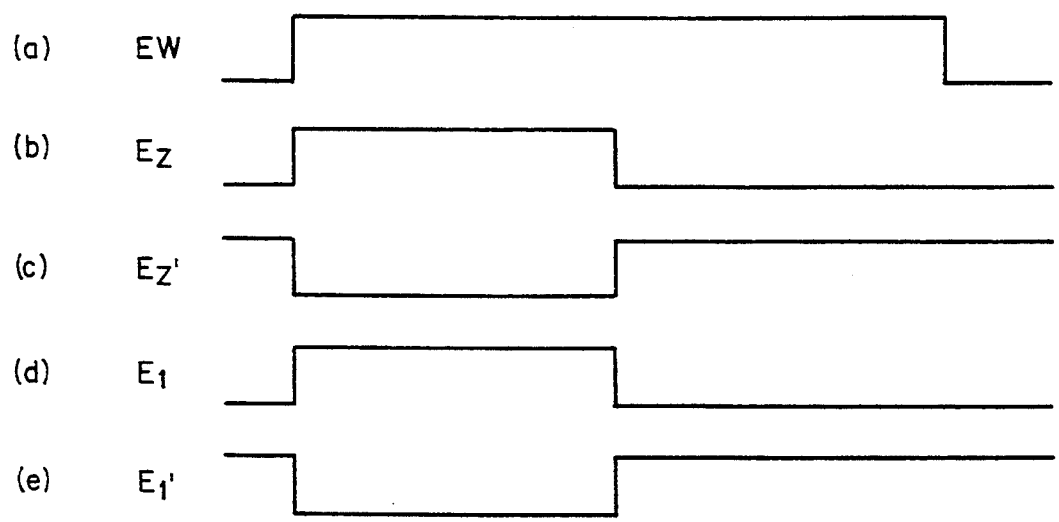
FIG. 3 is a timing diagram for illustrating specific operation of one embodiment of the present invention.
Figure 3B:
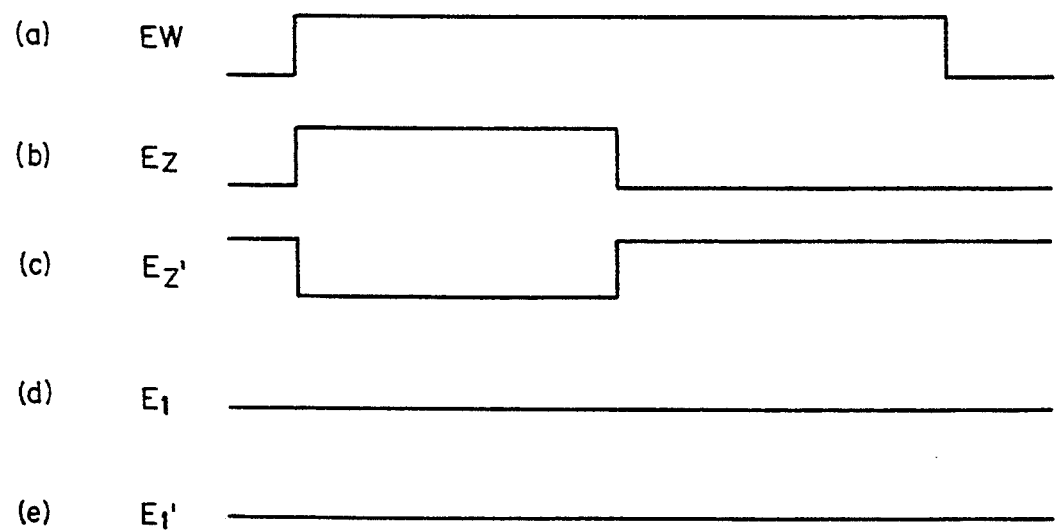
Figure 4:
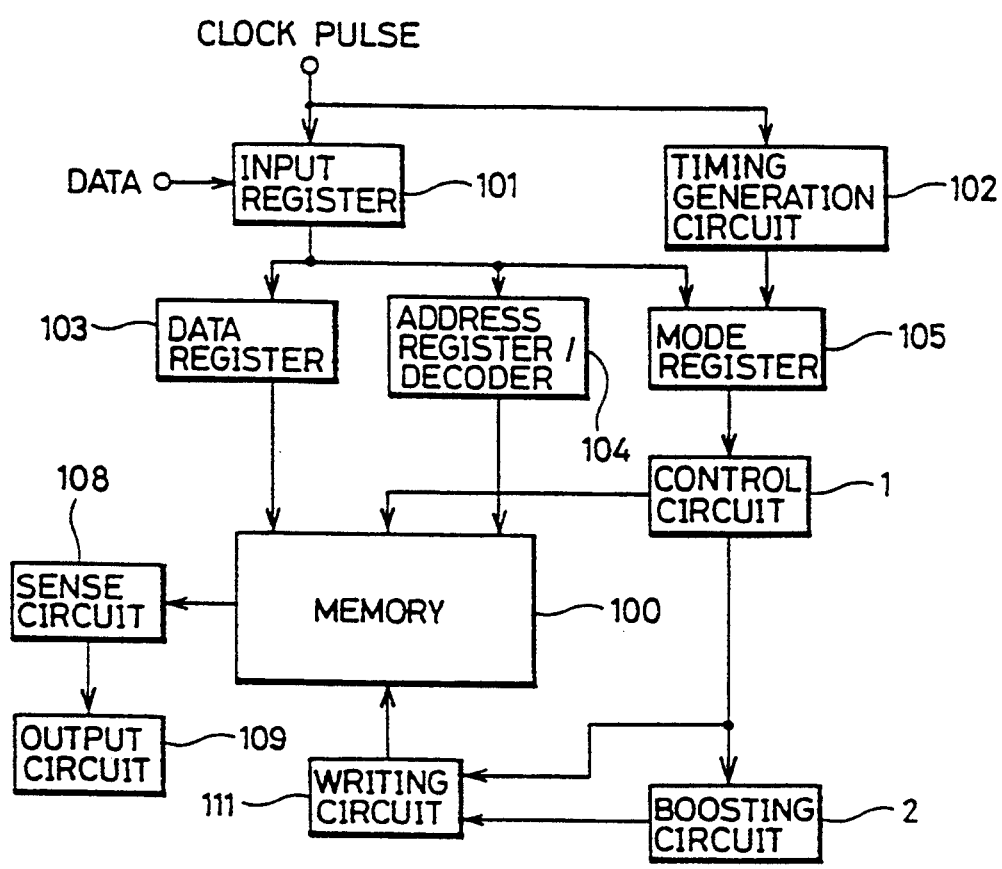
FIG. 4 is a schematic block diagram of a conventional EEPROM.
Figure 5:
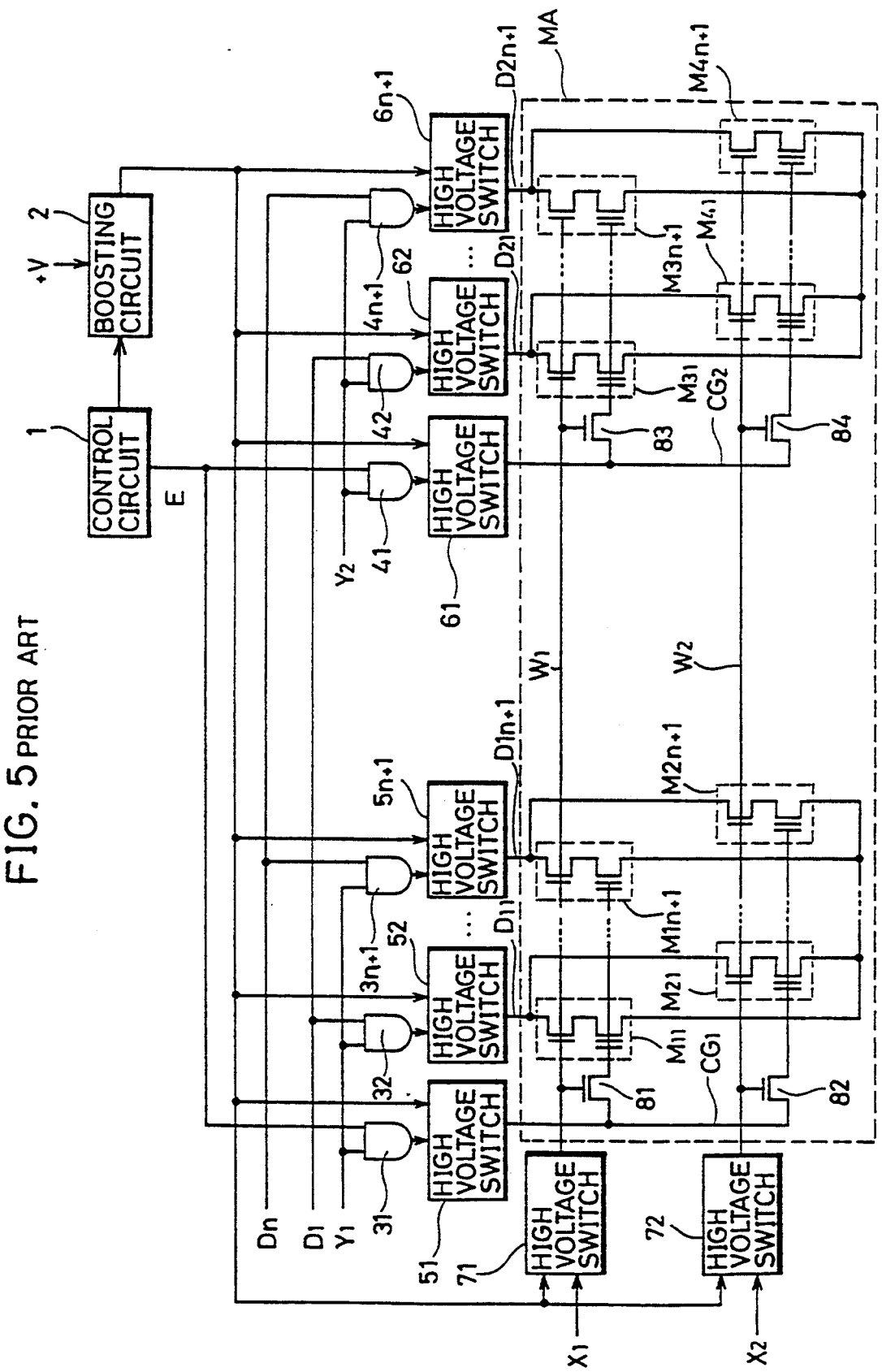
FIG. 5 is a specific block diagram of the periphery of the memory cell shown in FIG. 4.

FIGS. 3A and 3B are timing charts showing the operation of the embodiment shown in FIG. 2. The specific operation of one embodiment of the present invention will be described with reference to FIGS. 2, 3A and 3B. When an erase mode signal or a write mode signal is applied to control circuit 110 from mode register 105, timer circuit 121 of control circuit 110 applies the EW signal at "H" level shown in FIG. 3A (a) to boosting circuit 2. In response, boosting circuit 2 applies a high voltage to a high voltage switches 51, 52 ... 5n, 61, 62 ... 6n and 71 and 72. In response to the erase mode signal, timer circuit 121 applies the E2 signal at "H" level to AND gate 123, as shown in FIG. 3A (b). AND gate 123 applies an E1 signal at the "H" level such as shown in FIG. 3A (d) to AND gate 31. The E1 signal is inverted by NOR gate 76, and an E1' signal which is at the "L" level such as shown in FIG. 3A (e) is applied to AND gates 32 ... 3n+1.

When data D1 to D8 are set to the "L" level so as to erase memory cell M11 at the first row and the first column, the address X1 is set to "H" level, X2 to "L" level, Y1 to "H" level, and Y2 is set to "L" level. Consequently, AND gate 31 is opened, high voltage switch 51 set control gate signal CG1 to 20 V, and high voltage switch 71 sets word signal W1 to 20 V. Consequently, transistor 81 is rendered conductive, a high voltage is applied to the control gate of memory cell M11 and the data is erased.

When data in memory cell M31 in area M20 is to be erased, address Y should be set to "L" level and Y2 should be set to "H" level.

When data is to be written by setting the signal input to external terminal 107 to "H" level, timer circuit 121 outputs the EW signal which is at "H" when the write mode signal is applied from mode register 105, and it also applies the E2 signal which is at "L" level in the latter half period of the EW signal to AND gates 123 and 41. Data D1 to D8 are set to desired values, and address signals X1, X2, Y1 and Y2 are at the same state as in the erase mode. Since signals at the "L" level are output from AND gates 123 and 41, control gate signals CG1 and CG2 attain the "L" level. An output from inverter 122 is at "L" level, and the E1 signal is also at the "L" level. Therefore, output signal E1' from NOR gate 76 is at the "H" level, and is applied as a writing allowance signal to AND gates 32 ... 3n+1. When data D8, for example, is set to the "H" level, a high voltage is applied to the digit signal D11, and thus data is written to memory cell M11.

When data is to be written to memory cell M31, for example, in area M20, the address signal Y2 should be set to "H" level, and address signal Y1 should be set to "L" level.

When the signal input to terminal 107 is set to "L" level, an erase mode signal or a write mode signal is applied to control circuit 110, and even when the EW signal at "H" level is applied from timer circuit 121 as shown in FIG. 3B (a), the AND gate 123 is kept closed, and therefore the E1 signal is set to "L" level as shown in FIG. 3B (d). An output signal from inverter 122 attains "H" level and output signal E1' from NOR gate 76 also attains "L" level as shown in FIG. 3B (e) serving as a write prohibiting signal to close AND gates 32 ... 3n+1, erasure and writing of data in region M10 is prohibited.

However, as to the area M20, it is independent from the state of the signal input to terminal 107. Therefore, repetitive erasure and writing can be effected.

As described above, according to the embodiment of the present invention, after erasure or writing of data in area M10 is done by setting the signal input to terminal 107 at "H" level, by setting the signal input to terminal 107 to "L", erasure or writing of data in area M10 is prohibited, and therefore repetitive erasure or writing of data in area M20 only is allowed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device in which electrical rewriting of data is possible, comprising:
    non-volatile semiconductor memory means including first and second memory areas in which electrical rewriting of data is possible;
    a single line to which an external control signal is input; and
    control means for allowing rewriting of data to said first and second memory areas in response to the signal input to said line which is at a first level, and for inhibiting rewriting of data to said first memory area and for allowing rewriting of data to said second memory area, in response to the signal input to said line which is at a second level different from said first level,
    said control means comprising timer means for generating an internal control signal supplied together with said external control signal to control rewriting of data to said first memory area.

2. The non-volatile semiconductor memory device according to claim 1, wherein
    said control means includes
        first writing means provided corresponding to the first memory area of said semiconductor memory means for writing data to said first memory area,
        second writing means provided corresponding to the second memory area of said semiconductor memory means for writing data to said second memory area, and
        gate means outputting a writing allowance signal for allowing writing by said first and second writing means in response to a control signal applied to said line which is at a first level, and for outputting a writing prohibiting signal prohibiting writing by said first writing means and a writing allowance signal for allowing writing by second writing means in response to said control signal which is at a second level.

3. The non-volatile semiconductor memory device according to claim 2, further comprising
    address designating means for designating addresses of the first and second memory areas in said semiconductor memory means, wherein
    said controlling means comprises boosting means for boosting a supply voltage to generate a high voltage;
    said first writing means includes first switching means responsive to an address signal applied from said address designating means and to the write allowance signal applied from said gate means for applying a high voltage from said boosting means to the first memory area of said semiconductor memory means for writing data; and
    said second writing means comprises second switching means responsive to the address signal applied from said address designating means and the writing allowance signal applied from said gate means for applying the high voltage from said boosting means to the second memory area of said second memory means for writing data.

4. The non-volatile semiconductor memory device according to claim 3, wherein
    said boosting means comprises first high voltage generating means for generating a high voltage for writing data in the first memory area of said semiconductor memory means, and
    second high voltage generating means for generating a high voltage for writing data in the second memory area of said semiconductor memory means.

5. The non-volatile semiconductor memory device according to claim 3, wherein
    said semiconductor memory means comprises:
        a plurality of memory transistors arranged in a plurality of rows and columns constituting said first and second memory areas;
        selective transistors provided corresponding to said memory transistors each including a control electrode and first and second electrodes, activating the corresponding memory transistor when the first electrode is connected to the corresponding memory transistor to select the same;

first digit lines arranged in said column direction connected to the second electrodes of the selective transistors corresponding to the memory transistors constituting said first memory area;

second digit lines arranged in said column direction connected to the first electrodes of the selective transistors corresponding to the memory transistors constituting said second memory area;

first word lines arranged in said row direction connected to the control electrodes of the selective transistors corresponding to the memory transistors constituting said first memory area; and second word lines arranged in said row direction connected to the control electrodes of the selective transistor corresponding to the memory transistors constituting said second memory area; wherein said address designating means comprises means for outputting a column address signal and a row address signal of said memory transistor;

said first switching means comprises first column switching means provided corresponding to each column in the first memory area of said semiconductor memory means, responsive to the column address signal applied from said address designating means for applying a high voltage to the first digit line of the corresponding selective transistors, and first row switching means provided corresponding to each row of the first memory area of said semiconductor memory means, responsive to the row address signal applied from said address designating means for applying a high voltage to the first word line of the corresponding selective transistor;

said second switching means comprises second column switching means provided corresponding to each column in the second memory area of said semiconductor memory means, responsive to the column address signal applied from said address designating means for applying a high voltage to the second digit line of the corresponding selective transistor, and second row switching means provided corresponding to each row in the second memory area of said semiconductor memory means, responsive to the row address signal applied from said address designating means for applying a high voltage to the second word line of the corresponding selective transistor. control signal to control rewriting of data to said first memory area.

6. The memory device of claim 1, wherein said control means further comprises a gate circuit responsive to said external and internal control signals for supplying an enabling signal to said first memory area to allow rewriting of data to said first memory area when said signal input is at said first level and to inhibit rewriting of data to said first memory area when said signal input is at said second level.

* * * * *